US009507358B2

(12) United States Patent
David et al.

(10) Patent No.: US 9,507,358 B2
(45) Date of Patent: Nov. 29, 2016

(54) ADAPTIVE BIAS CIRCUIT

(71) Applicant: NXP B.V., Eindhoven (NL)

(72) Inventors: Stephane David, Caen (FR); Fabian Riviere, Caen (FR)

(73) Assignee: NXP B.V., Eindhoven (NL)

( * ) Notice: Subject to any disclaimer, the term of this patent is extended or adjusted under 35 U.S.C. 154(b) by 20 days.

(21) Appl. No.: 14/662,365

(22) Filed: Mar. 19, 2015

(65) Prior Publication Data

US 2015/0268680 A1    Sep. 24, 2015

(30) Foreign Application Priority Data

Mar. 21, 2014  (EP) .................................... 14290074

(51) Int. Cl.
| | |
|---|---|
| G11C 5/14 | (2006.01) |
| G05F 1/46 | (2006.01) |
| H03F 1/02 | (2006.01) |
| H03F 1/30 | (2006.01) |
| H03F 3/195 | (2006.01) |

(52) U.S. Cl.
CPC ............. *G05F 1/463* (2013.01); *H03F 1/0266* (2013.01); *H03F 1/0272* (2013.01); *H03F 1/30* (2013.01); *H03F 3/195* (2013.01); *H03F 2200/294* (2013.01); *H03F 2200/447* (2013.01)

(58) Field of Classification Search
CPC .... H03F 1/302; H03F 2200/18; H03F 1/301; H03F 1/0261; H03F 1/30
USPC .................................. 327/530; 330/285, 296
See application file for complete search history.

(56) References Cited

U.S. PATENT DOCUMENTS

| | | | | |
|---|---|---|---|---|
| 6,130,579 A | * | 10/2000 | Iyer et al. ...................... 330/285 |
| 6,414,553 B1 | * | 7/2002 | Luo ................................ 330/296 |
| 6,624,700 B2 | * | 9/2003 | Luo et al. ....................... 330/281 |
| 2004/0066234 A1 | * | 4/2004 | Luo et al. ....................... 330/296 |
| 2004/0104763 A1 | * | 6/2004 | Pai ................................. 327/539 |
| 2005/0030106 A1 | * | 2/2005 | Yamamoto ................ H03F 1/52 330/298 |
| 2007/0030064 A1 | * | 2/2007 | Yu ........................... G01R 21/10 330/140 |
| 2009/0146741 A1 | * | 6/2009 | Okuma .................... H03F 1/302 330/306 |
| 2011/0090011 A1 | | 4/2011 | Chang et al. |
| 2012/0139635 A1 | | 6/2012 | Ho et al. |
| 2013/0138383 A1 | * | 5/2013 | Filler ..................... G06F 11/263 702/123 |
| 2015/0061770 A1 | * | 3/2015 | Luo et al. ....................... 330/288 |

FOREIGN PATENT DOCUMENTS

EP    1 026 822 A2    8/2000

OTHER PUBLICATIONS

Lau, K. W., et al; "Self-adaptive biasing technique for microwave bipolar amplifier linearization"; Electronics Letter, vol. 43, No. 3; 2 pages (Feb. 1, 2007).
Cardarilli, Gian-Carlo et al; "CMOS adaptive biasing circuits for low-power applications"; Proc. 21st Int'l Conference on Microelectronics, vol. 2, Nis, Yugoslavia; 4 pages (Sep. 1997).
Tsuruya, Yumiko et al; "A Non-Watt Power CMOS Amplifier with Adaptive Biasing for Power-Aware Analog LSIs"; Proceedings of the IEEE ESSCIRC; pp. 69-72 (2012).
Extended European Search Report for application No. 14290074.5 (Jun. 17, 2014).

* cited by examiner

*Primary Examiner* — Quan Tra

(57) ABSTRACT

An amplifier arrangement for amplifying an alternating signal, comprising an amplifier and an adaptive biasing circuit, the amplifier configured to receive an alternating signal for amplification and a bias signal for biasing the amplifier from the adaptive biasing circuit, the adaptive biasing circuit comprising a PTAT circuit wherein the PTAT circuit is configured to receive the alternating signal and modulate the bias signal based on the alternating signal.

13 Claims, 2 Drawing Sheets

ADAPTIVE BIAS CIRCUIT

CROSS-REFERENCE TO RELATED APPLICATIONS

This application claims the priority under 35 U.S.C. §119 of European patent application no. 14290074.5, filed on Mar. 21, 2014, the contents of which are incorporated by reference herein.

This invention relates to an adaptive bias circuit for providing an amplifier with an adaptive bias signal. The invention also relates to an amplifier arrangement including an amplifier and said adaptive bias circuit. It also relates to an integrated circuit and an electronic device incorporating said amplifier arrangement.

Many of the characteristics of an amplifier are strongly dependent on a biasing current applied to the amplifier. Linearity and gain are two examples of such characteristics. When strong performance is not required, the biasing current of an amplifier can be reduced. Inversely, the bias current can be increased when high linearity or gain is needed. Often, the conditions for which high performance is required will occur when the input signal to the amplifier is of high amplitude. It is therefore desirable to adapt the biasing current of the amplifier as a direct function of the amplitude of the input signal. This technique is termed adaptive biasing.

FIG. 1 shows a known arrangement in which an amplifier 1 is provided with an adaptive biasing signal by an adaptive bias assembly 2. The adaptive bias assembly comprises a detector 3, a comparator 4, a reference circuit 5 and a biasing circuit 6. The detector 3 comprises a rectifier to rectify an alternating signal that is amplified by the amplifier 1. The rectified signal is applied to the comparator 4 along with a reference signal from the reference circuit 5. The output of the comparator 4 is used by the biasing circuit 6 to set the bias current applied to the amplifier 1. Thus, in addition to the biasing circuit 6, which applies the bias signal, an additional diode and capacitor is typically required for the detector 3 and a comparator or amplifier for the comparator 4. The component count for such an adaptive bias assembly 2 is high as well as die area required to implement the assembly. Further, the components add to the quiescent current, which is particularly detrimental for battery operated devices, for example.

According to a first aspect of the invention we provide an adaptive bias circuit for providing an adaptive bias signal to an amplifier, the adaptive bias circuit comprising a Proportional to Absolute Temperature (PTAT) circuit wherein the PTAT circuit is configured to modulate the bias signal based on an alternating signal for amplification by said amplifier.

The use of a PTAT circuit as an adaptive bias circuit is advantageous. Proportional To Absolute Temperature circuit (PTAT) or ΔVbe current source biasing circuits, can be effectively integrated and have a relatively low demand on semiconductor area. The use of such a circuit to provide an adaptive bias signal and, in particular, one configured such that the alternating signal effectively modulates its bias signal output is advantageous. The alternating signal may comprise a radio frequency (RF) signal. It will be appreciated that the PTAT circuit may be configured to receive the alternating signal before or after amplification by the amplifier.

According to a second aspect of the invention, we provide an amplifier arrangement configured to receive an adaptive bias signal from the adaptive bias circuit of the first aspect.

Thus, we provide an amplifier arrangement for amplifying an alternating signal, comprising an amplifier and an adaptive biasing circuit, the amplifier configured to receive an alternating signal for amplification and a bias signal for biasing the amplifier from the adaptive biasing circuit, the adaptive bias circuit comprising a Proportional to Absolute Temperature (PTAT) circuit wherein the PTAT circuit is configured to receive the alternating signal and modulate the bias signal based on the alternating signal that can be from the input or the output of the amplifier.

The PTAT circuit may be configured to receive the alternating input signal such that the alternating input signal is rectified. Thus, the alternating signal may be applied to components of the PTAT circuit that would typically act to provide a temperature dependent signal, wherein said components act as a rectifier such that the magnitude of the alternating signal may act to provide an adaptive bias signal.

The PTAT circuit may comprise a first transistor and a second transistor each comprising a base terminal, a collector terminal and an emitter terminal, the first and second transistors coupled together by a base connection between their respective base terminals. It will be appreciated that coupled may comprise electrically coupled or connected. The circuit may further include a resistor coupled at the emitter terminal of the first transistor. The first transistor and/or second transistors may comprise Bipolar Junction Transistors or may comprise a MOS transistors. The resistor may be grounded.

The PTAT circuit may be configured such that the alternating signal is rectified by the junction of the first transistor.

The PTAT circuit may be configured to receive the alternating input signal at the base terminal of the first transistor.

The PTAT circuit may include a filtering capacitor arranged in parallel with the resistor, the resistor and filtering capacitor coupled to ground. The base-emitter junction of the transistor, resistor and filtering capacitor can be considered to be a peak detector in that the capacitor serves to tune the release time. Further, the filtering capacitor can be considered to filter harmonics from the rectified RF signal.

The arrangement may include a sampling capacitor having a first plate and a second plate, the first plate coupled to an output of the amplifier for receiving the alternating input signal and the second plate coupled to the base terminal of the second transistor. The sampling capacitor may, alternatively, receive the alternating signal prior to amplification by the amplifier.

The second transistor may include an inter-terminal connection which couples its collector terminal to its base terminal.

The inter-terminal connection may be coupled to a node on the base connection, wherein the PTAT circuit includes a first isolating resistor located between the node and the base terminal of the first resistor and a second isolating resistor located between the node and the base terminal of the second transistor. The node may be coupled to a first plate of a capacitor and a second plate of the capacitor is coupled to ground. The isolating resistors may have the same resistance or their ratio could be correlated to the current/area ratio of the first and second resistors. This is advantageous as the operation of the circuit in response to temperature will be maintained when no alternating or RF signal is present.

The emitter terminal of the second transistor may be coupled to ground. The PTAT circuit may be configured to receive the alternating signal from an output of the amplifier or an input of the amplifier. The amplifier may comprise multiple stages.

The PTAT circuit may be associated with a current mirror circuit such that the current applied to the collector terminals of the first and second transistor are equal.

According to a third aspect of the invention, we provide an integrated circuit including the adaptive bias circuit of the first aspect of the invention or the amplifier arrangement defined in the second aspect of the invention.

The integrated circuit may comprise an amplifier module for a satellite navigation device, such as a Global Positioning System (GPS) device, or other location aware electronic device. The invention is also applicable to any other radio system evolving within an aggressive environment such as a cellular telephone (incorporating WiFi, WCDMA, LTE, Bluetooth, etc. . . ), industrial radio network for a sensor arrangement (incorporating Zigbee, Bluetooth low-energy, etc. . . ) among others.

According to a fourth aspect of the invention, we provide an electronic device including the amplifier arrangement defined in the second aspect of the invention.

The electronic device may comprise a mobile telephone, satellite navigation device or other location aware device.

There now follows, by way of example only, a detailed description of embodiments of the invention with reference to the following figures, in which.

Figure 1:
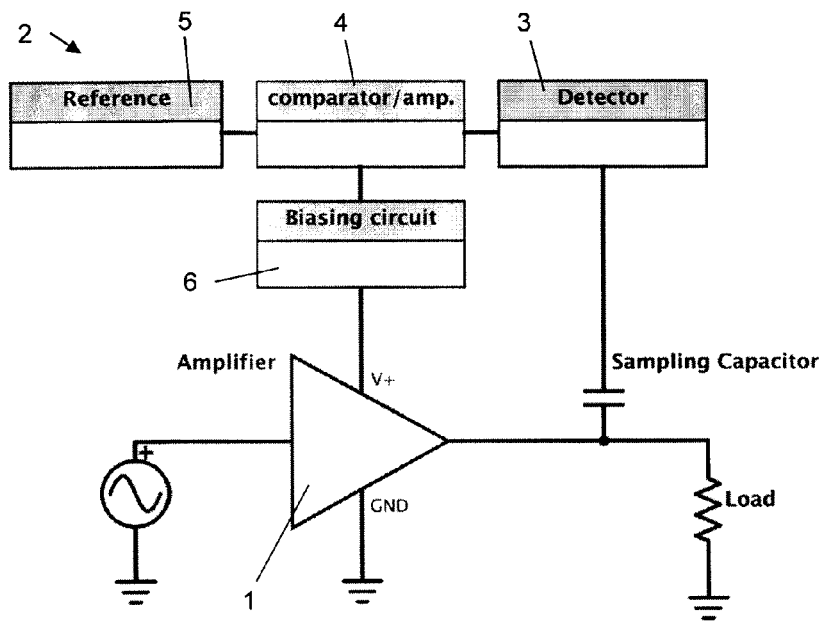
FIG. 1 shows a schematic diagram of a known amplifier with adaptive bias assembly.
Figure 2:
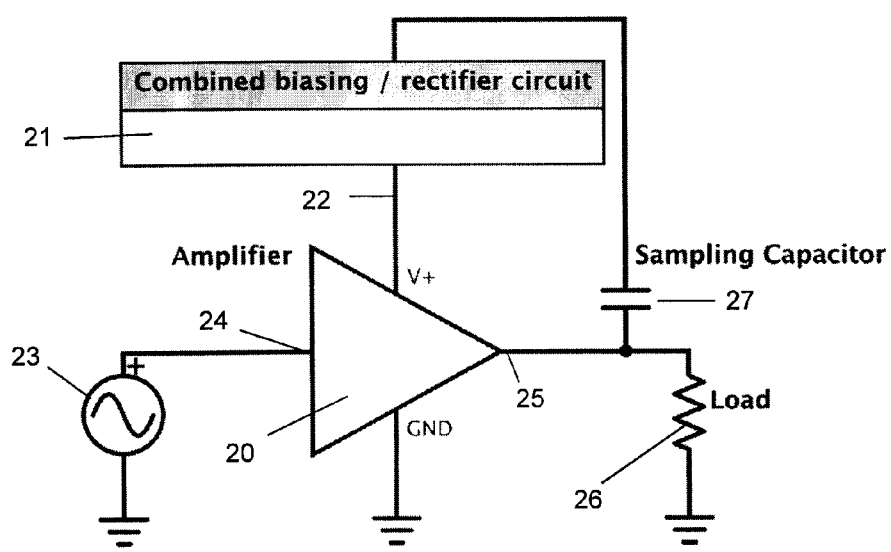
FIG. 2 shows a schematic diagram of an embodiment of an amplifier with an adaptive bias circuit.

FIG. 2 shows an amplifier 20 having an adaptive bias circuit 21 that is configured to apply a bias signal 22 to the amplifier 20. The amplifier 20 is configured to amplify an alternating signal and, in particular, an RF signal. The amplifier 20 is configured to receive the alternating signal 23 at an amplifier input 24 and provide an amplified version of the alternating signal at an amplifier output 25. The alternating signal may then be applied to a load 26.

The adaptive bias circuit 21 comprises a PTAT circuit that is configured to receive the alternating signal. The adaptive bias circuit may comprise a ΔVBE based current source (PTAT) circuit. The alternating signal may be received via a sampling capacitor 27. It has been found that the components of the PTAT circuit can be used to rectify the alternating signal such that it can be used to modulate the output of the PTAT circuit 21 such that the output of the circuit 21 comprises an adaptive bias signal. Thus, the PTAT circuit generates a bias signal for the amplifier that is adaptive to the alternating signal received by the amplifier for amplification.

Figure 4:
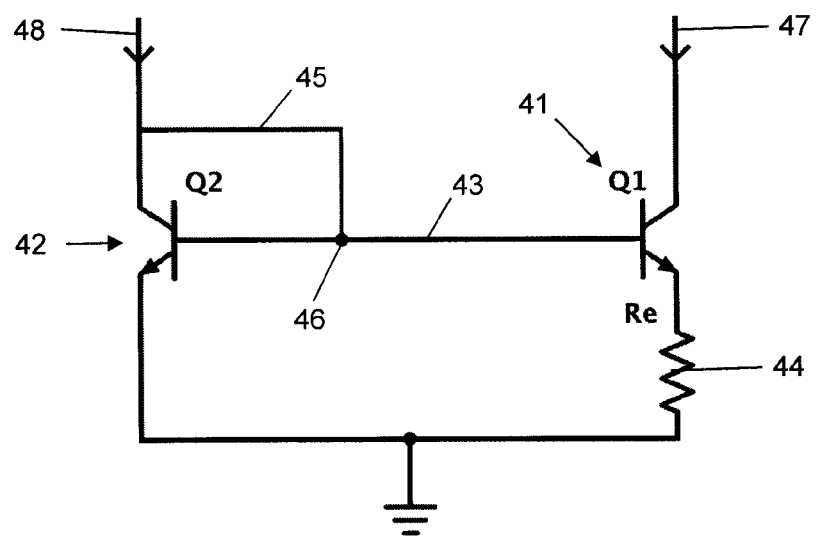
FIG. 4 shows an example PTAT circuit.

FIG. 4 shows a standard PTAT circuit, which forms the basis for the adaptive bias circuit 21 of the invention. The PTAT circuit 40 comprises a first transistor 41 and second transistor 42, which in this example comprise bipolar junction transistors. A base terminal of the first transistor 41 is coupled or electrically connected to a base terminal of the second transistor 42 by a base connection 43. Emitter terminals of the first and second transistors are coupled to ground with the emitter terminal of the first transistor 41 coupled to ground via a resistor 44. A collector terminal of the second transistor 42 is electrically coupled, by an inter-terminal connector 45, to a node 46 on the base connector 43. The PTAT circuit includes a first terminal 47 coupled to a collector terminal of the first transistor 41 and a second terminal 48 coupled to the collector terminal of the second transistor 42. It will be appreciated by those skilled in the art that a current mirror circuit may provide current to the collector terminals 47, 48, although current sources could alternatively be provided that may provide substantially equal current to the first and second transistors 41, 42.

Figure 3:
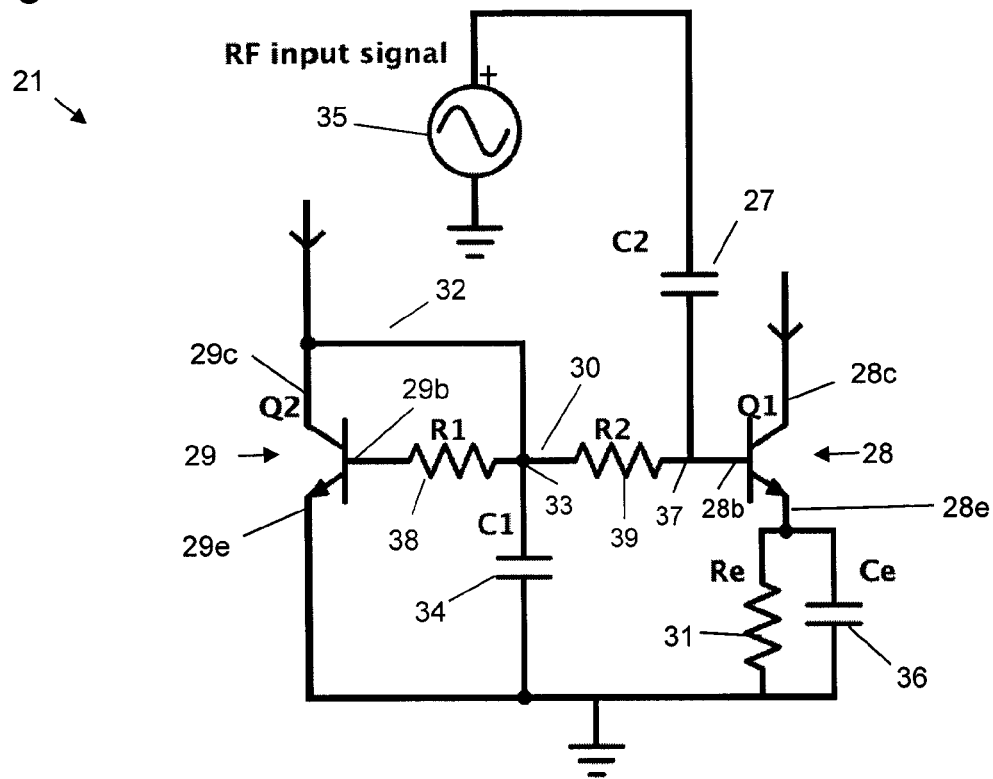
FIG. 3 shows a schematic diagram of the adaptive bias circuit of FIG. 2.

FIG. 3 shows the adaptive bias circuit 21 in more detail. The adaptive bias circuit 21 is based on a PTAT circuit and comprises a first transistor 28 and second transistor 29, which in this example comprise bipolar junction transistors. The first transistor 28 comprises a collector terminal 28c, a base terminal 28b and an emitter terminal 28e. Likewise, the second transistor 29 comprises a collector terminal 29c, a base terminal 29b and an emitter terminal 29e. The base terminal 28b of the first transistor 28 is electrically coupled to the base terminal 29b of the second transistor 29 by a base connector 30. The emitter terminal 29e is coupled to ground. The emitter terminal 28e of the first transistor is coupled to ground via a resistor 31. The collector terminal 29c of the second transistor 29 is electrically coupled, by an inter-terminal connector 32, to a node 33 on the base connector 30.

The alternating signal or RF signal is shown schematically as an alternating source 35 that is applied directly (by way of DC blocking capacitor 27) to the adaptive bias circuit 21. The alternating signal may comprise the unamplified alternating signal supplied to the input 24 of the amplifier 20 or may comprise an amplified version of the alternating signal supplied from the output 25 of the amplifier 20. The alternating signal can be picked up at the output of the amplifier or at the input which may depend on the circuit's 21 linear gain input range or sensitivity. The alternating signal is shown as being supplied via the sampling capacitor 27. The sampling capacitor may act to block DC signals to the amplifier 20 and allows a small part of the output of the amplifier 20 to be fed back (i.e. sampled) into the PTAT circuit where it can be rectified to a dc component for providing the adaptive bias signal.

The alternating signal is applied to the base terminal 28b of the first transistor 28. In FIG. 3 the alternating signal is received at a node 37 on the base connector 30. The adaptive bias circuit 21 thus utilises the junction of the first transistor 28 and the resistor 31 to rectify the alternating signal, as will be described in more detail below.

The adaptive bias circuit 21 optionally includes a filtering capacitor 36 in parallel with the resistor 31. The parallel arrangement of the resistor 31 and capacitor 36 is coupled to the emitter terminal 28e at a first end and ground at a second end. The filtering capacitor 36 can be added to provide the necessary charge to assist in rectifying the alternating signal to a DC component. It can be considered to filter out any alternating signal still present after the transistor 28 (further harmonic filtering can be provided after 28c). Thinking of the transistor, resistor and capacitor as a peak detector, the capacitor acts to adjust detector release time (envelop detection) and to filter out harmonic content from source 35 in order to substantially keep an image of the envelop of the alternating signal across the resistor 31.

The adaptive bias circuit 21 optionally includes a pair of isolating resistors 38, 39 configured to isolate the base terminal 29b of the second transistor 29 from the alternating signal. Thus, the first isolating resistor 38 is arranged between the base terminal 29b of the second transistor 29 and the node 33. The second isolating transistor 39 is arranged between the node 33 and the node 37. The node 33 is coupled to a first plate of a capacitor 34 and the second plate of the capacitor is coupled to ground. The capacitor 34 and second isolating resistor 39 act as a low pass filter to filter out alternating components of the alternating signal that may leak to the "DC" side or second transistor 29 side of the PTAT circuit.

The adaptive bias signal may be formed from the current flowing through the first transistor 28 such as current at the collector terminal 28c of the first transistor 28. Alternatively the voltage at the emitter terminal 28e may be used to form the adaptive bias signal. However, it will be appreciated that a PTAT signal, as modulated by the RF signal, can be extracted from various parts of the PTAT circuit for application to the amplifier 20.

Taking the resistance of the resistor 31 as Re and the capacitance of the capacitor 36 as Ce, the following classical PTAT analysis can be determined.

If the conduction angle of the rectifying transistor 28 extends over a full wave ($2\pi$), in other words, the amplitude of the alternating signal is small enough to keep the first transistor 28 from shutting off, $$V_{BE2} - V_{BE1} = Z_{rec}(I_{PTAT} + \Delta I_{rec})$$

where $V_{BE2}$ comprises the base-emitter voltage of the second transistor 29 and $V_{BE1}$ comprises the base-emitter voltage of the first transistor 28, $Z_{rec}$ comprises the impedance of the resistor 31 and capacitor 36, $I_{PTAT}$ comprises the current through the first transistor 28 and $\Delta I_{rec}$ comprises the rectified current of the alternating signal.

And therefore, $$I_{PTAT} + \Delta I_{rec} = \frac{V_T}{Z_{rec}} \ln\left(\frac{N}{M}\right)$$

Where $$\frac{N}{M}$$

is the ratio of emitter area of the first transistor 28 and the second transistor 29.

Around DC values, the impedance $Z_{rec}$ is equal to the resistance Re of the resistor 31. In the presence of an RF input signal, $Z_{rec}$ is dominated by the capacitor 36.

The current is assumed equal in both branches. In practical terms, this is generally achieved by the means of a current mirror as will be known to those skilled in the art. Alternatively current sources could be used.

The rectified current $\Delta I_{rec}$, will be dependent upon the coupling ratio of RF signal into the base 28b of the first transistor 28, the value of Ce and the value of Re. The amount of rectified current that can realistically be used to increase the biasing of the main amplifying transistor 20 will depend on how the rest of the biasing is implemented, and more specifically, on the transfer function between $I_{PTAT}$ and the main amplifier 20 biasing. In that respect, $\Delta I_{rec}$ may be required to be large, or small.

If a large $\Delta I_{rec}$ is required, then the presence of the optional capacitor 36 is advantageous. If a small $\Delta I_{rec}$ is sufficient, then the capacitor 36 can be omitted. It will be appreciated that this depends on the particular application. Omission may depend on the harmonic content that can be admitted. However capacitor Ce may be required for release time control unless the intrinsic parasitic capacitance of transistor 28 is sufficient.

There is no closed form expression for the solution of the non-linear equation describing the I-V characteristic of a p-n junction with feedback. As such, the dimensioning of the components of the adaptive bias circuit 21 may be achieved through experimentation depending on the intended application.

$V_{BE} + v_{be}$ is the DC ($V_{BE}$) base emitter voltage plus the time varying base emitter ($v_{be}$) voltage introduced by the alternating signal from 35 of the first transistor 28. $I_0 + i_c$ is the DC ($I_0$) and time varying collector ($i_c$) current of the first transistor 28. $I_S$ is the saturation current. Thus, $$I_0 + i_c = I_s e^{\frac{V_{BE} + v_{be}}{V_T}}$$

$v_b$, the voltage at the base terminal 28b, where $v_{be} = v_b - R_e * i_c$, is equal to the RF signal from 35 without its DC components and eventually attenuated depending on the output impedance at source 35 and the input impedance at node 37. Where $R_e$ is the resistance of the resistor 31.

It can be shown that the increase in the mean emitter voltage, $v_e$, is obtained by integrating the function $v_e = f(v_b)$ over a full period of a sinusoidal input signal, and dividing by $2\pi$. Therefore, it can be demonstrated that the alternating signal modulates the output of the PTAT circuit such to provide the adaptive bias signal.

It has been determined that, for a circuit with an operating frequency of around 1.5 GHz, a typical value for the sampling capacitor 27 may be approximately 200 fF, the isolating resistors 38, 39 may be approximately 10 kOhms, the resistor 31 may be approximately 1 kOhm and the capacitor 34 and filtering capacitor 36 may have a capacitance of approximately 10 pF.

The amplifier 20 and adaptive bias circuit 21 of the invention have particular application in situations where RF functions are required to adapt their level of biasing as a function of their RF environment. This includes the Low Noise Amplifier of a GPS receiver, for example, within a mobile telephone. The proximity of the mobile telephone's transmitter to the GPS receiver can deteriorate the sensitivity of the Low Noise Amplifier of the GPS receiver through non-linear mixing. This invention also has application for any amplifier requiring high levels of linearity and low current consumption.

The invention claimed is:

1. An amplifier arrangement comprising:
    an amplifier; and
    an adaptive bias circuit configured to provide an adaptive bias signal to the amplifier, the adaptive bias circuit comprising a Proportional to Absolute Temperature (PTAT) circuit configured to modulate the adaptive bias signal based on an alternating signal for amplification by said amplifier, wherein the PTAT circuit further comprises:
        a first transistor and a second transistor, each comprising a base terminal, a collector terminal and an emitter terminal;
        a first isolating resistor located between a base connection node and the base terminal of the first transistor;
        a second isolating resistor located between the base connection node and the base terminal of the second transistor;
        a first capacitor, wherein the base connection node is coupled to a first plate of the first capacitor and a second plate of the first capacitor is coupled to ground; and a sampling capacitor having a first plate and a second plate, the first plate coupled to an output of the amplifier for receiving the alternating signal and the second plate coupled to the base terminal of the second transistor.

2. The amplifier arrangement of claim 1, wherein the amplifier is configured to receive the alternating signal for amplification and the adaptive bias circuit is configured to receive the alternating signal and provide the adaptive bias signal to said amplifier.

3. The amplifier arrangement according to claim 1, wherein the PTAT circuit is configured to receive the alternating signal such that the alternating signal is rectified.

4. The amplifier arrangement according to claim 1, wherein the first and second transistors are coupled together by the base connection node between their respective base terminals and a resistor is coupled at the emitter terminal of the first transistor.

5. The amplifier arrangement according to claim 4, wherein the PTAT circuit is configured such that the alternating signal is rectified by the first transistor and the resistor.

6. The amplifier arrangement according to claim 4, wherein the PTAT circuit is configured to receive the alternating signal at the base terminal of the first transistor.

7. The amplifier arrangement according to claim 4, wherein the PTAT circuit further comprises:
a filtering capacitor arranged in parallel with the resistor, the resistor and filtering capacitor coupled to ground.

8. The amplifier arrangement according to claim 4, wherein the second transistor includes an inter-terminal connection which couples its collector terminal to its base terminal.

9. The amplifier arrangement according to claim 8, in which the inter-terminal connection is coupled to the base connection node.

10. The amplifier arrangement according to claim 4, wherein the emitter terminal of the second transistor is coupled to ground.

11. The amplifier arrangement according to claim 1, wherein the PTAT circuit is configured to receive the alternating signal from an output of the amplifier.

12. The amplifier arrangement according to claim 1, wherein the PTAT circuit further comprises:
a current mirror circuit configured to supply a substantially equal current to collector terminals of first and second transistors.

13. An integrated circuit including the amplifier arrangement defined in claim 2.

* * * * *